United States Patent
Ho

[11] Patent Number: 6,118,438
[45] Date of Patent: *Sep. 12, 2000

[54] LOW COMMENT MODE IMPEDENCE DIFFERENTIAL DRIVER AND APPLICATIONS THEREOF

[75] Inventor: Chak Cheung Edward Ho, Markham, Canada

[73] Assignee: ATI Technologies, Inc., Thornhill, Canada

[*] Notice: This patent is subject to a terminal disclaimer.

[21] Appl. No.: 09/287,807

[22] Filed: Apr. 7, 1999

Related U.S. Application Data

[63] Continuation-in-part of application No. 08/820,291, Mar. 18, 1997, Pat. No. 5,959,601.

[51] Int. Cl.[7] ............................ G09G 5/00; G09G 3/36
[52] U.S. Cl. ........................ 345/204; 345/98; 345/100
[58] Field of Search .............................. 345/87, 88, 98, 345/100, 204, 153–155

[56] References Cited

U.S. PATENT DOCUMENTS

| 4,721,943 | 1/1988 | Stallkamp | 345/22 |
| 4,745,485 | 5/1988 | Iwasaki | 345/98 |

*Primary Examiner*—Matthew Luu
*Attorney, Agent, or Firm*—Markison & Reckamp, P.C.

[57] ABSTRACT

A low common mode impedance differential driver includes an independent current source, a switching module, a dependent current source, and a bias control circuit. The independent and dependent current sources are operably coupled to the switching module to provide first and second current paths through the switching module. The bias control circuit is operably coupled to the dependent current source and to the differential output produced by the switching module. The bias control circuit provides a control signal to the dependent current source that causes the common mode of the differential output to be maintained within a desired tolerance.

12 Claims, 4 Drawing Sheets

સ6,118,438

LOW COMMENT MODE IMPEDENCE DIFFERENTIAL DRIVER AND APPLICATIONS THEREOF

This is a continuation-in-part of patent application having a Ser. No. 08/820,291, filed on Mar. 18, 1997, entitled METHOD AND APPARATUS FOR PARALLEL IN/SERIAL OUT TRANSMISSION and assigned to the same Assignee as the present patent application, now is the U.S. Pat. No. 5,959,601.

TECHNICAL FIELD OF THE INVENTION

This invention relates generally to parallel-to-serial transmissions and more particularly to a differential serial driver.

BACKGROUND OF THE INVENTION

Transmission of data from a processing engine to a display device for subsequent presentation or display is known. For example, data may be transmitted from a video graphics controller, or video graphics processing engine, to an LCD (liquid crystal diode) display panel for subsequent display. Because of the digital nature of the data (e.g., binary signal switching between zero volts and the voltage supply), electromagnetic interference (EMI) is generated. For relatively small amounts of data transmissions, the resulting EMI is practically negligible (i.e., the EMI does not adversely affect circuit operation and is below EMI levels established by regulatory agencies such as the Federal Communications Commission (FCC)).

As the LCD display increases in size and/or the complexity of the displayed data increases, the amount of data conveyed from the video graphics circuit is similarly increased. Not surprisingly, the generated EMI increases correspondingly to the increase in data transmission. In fact, in many high volume data transmissions, the EMI generated exceeds FCC regulations. Systems, such as computers, that employee the high volume data transmissions that are not FCC compliant are, as a result, not marketable.

To combat the EMI problem created from high volume data transmissions, a standard low voltage differential signaling (LVDS) for interface circuits has been developed. In particular, TIA/EIA-644 LVDS standard governs LVDS transmissions. The TIA/EIA-644 standard provides general specifications as to the accessible operating criteria for low voltage differential signaling. Such specifications require that signal transmissions be done using differential signaling, which substantially reduces the effects of the EMI generated by having the differential signals transmitted over a twisted wire pair, or at least an equivalent transmission medium. The specifications also dictate the signaling levels, such as the signal magnitude and the DC offset voltage. While the TIA/EIA-644 standard provides operational parameters, it does not provide information as to specific circuit implementations.

One TIE/EIA-644 standard compliance circuit has been developed by National Semiconductor (Part No. DS90CR581). In this circuit, National uses two pairs of cascaded transistors, which are switched as a full bridge inverter. The interconnecting nodes of each pair of cascaded transistors provide the differential output, while the ends of each of the pair of cascaded transistors are coupled to a current source and circuit return, respectively. The DC offset as specified in the standard is achieved by controlling the conductive impedance of the transistors to produce a voltage divider circuit. While this circuit works well in many applications, controlling the conductive impedance may provide manufacturing difficulties and, if the conductive impedance drifts due to manufacturing differences or gate drive circuits, the resulting differential output may not have the specified DC offset.

Therefore, a need exists for a method and apparatus that is TIA/EIA-644 compliant and is not heavily dependent on conductive impedances of the transistors and provides a low common mode impedance.

DETAILED DESCRIPTION OF A PREFERRED EMBODIMENT

Generally, the present invention provides a low common mode impedance differential driver and applications thereof. Such a differential driver includes an independent current source, a switching module, a dependent current source, and a bias control circuit. The independent and dependent current sources are operably coupled to the switching module to provide first and second current paths through the switching module. The bias control circuit is operably coupled to the dependent current source and to the differential output produced by the switching module. The bias control circuit provides a control signal to the dependent current source that causes the common mode of the differential output to be maintained within a desired tolerance. With such an embodiment, a differential driver is produced that has a low common mode impedance and is TIA/EIA-644 standard compliant.

Figure 1:
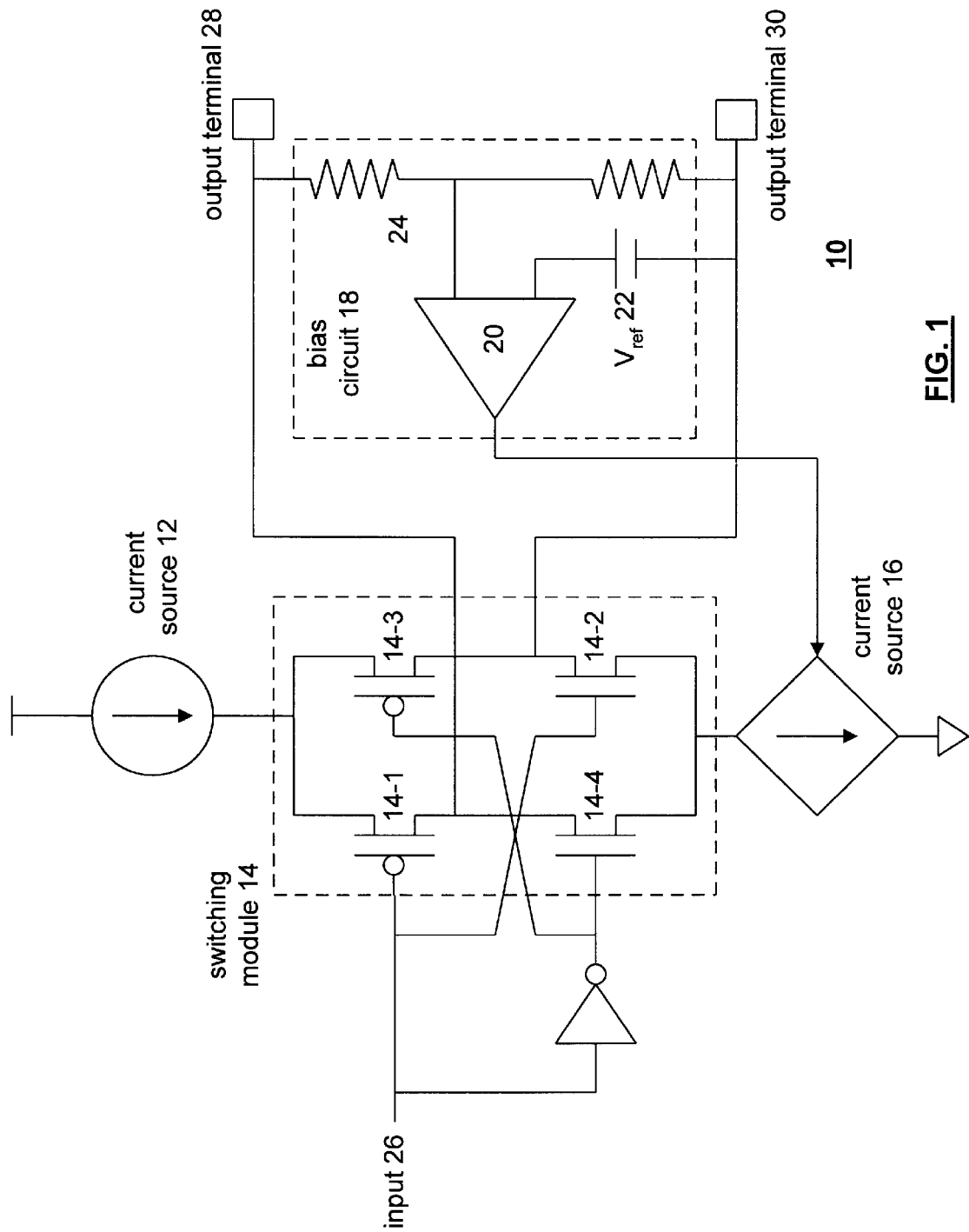
FIG. 1 illustrates a schematic block diagram of a low common mode impedance differential driver in accordance with the present invention.

The present invention can be more fully described with reference to FIGS. 1–4. FIG. 1 illustrates a schematic block diagram of a low common mode impedance differential driver 10. The differential driver 10 includes an independent current source 12, a switching module 14, a dependent current source 16, and a bias circuit 18. As shown, the switching module 14 includes a full bridge inverter configuration such that opposite transistors are active to provide a first and second current flow through the switching module and through the output terminals 28 and 30. The transistors of switching module 14 are gated via the input 26. For example, when input 26 is a logic 1, transistors 14-3 and 14-4 are active. With these transistors active, the current flow via output terminals 28 and 30 exits output terminal 30 and returns via output terminal 28. When input 26 is a logic 0, transistors 14-1 and 14-2 are active. With these transistors active, the current flow to the load (not shown) is out terminal 28 returning via output terminal 30. As such, a differential output is provided via output terminals 28 and 30.

The bias circuit 18 includes an operational amplifier 20, a voltage reference 22 and a voltage divider 24. The voltage divider 24 is operably coupled between the output terminals 28 and 30 wherein a tap of the divider is fed to an input of the amplifier 20. The other input of amplifier 20 is from the voltage reference 22. Utilizing a relatively high gain amplifier (e.g., 35 db gain or above), the output of the amplifier 20 provides a control signal to the dependent current source 16 based on common mode drift of the output terminals as sensed via the voltage divider 24. For example, the voltage reference 22 may be set to 1.25 volts. Accordingly, the tap of the voltage divider 24 will be regulated to 1.25 volts based on the control signal provided to the dependent current source 16.

Low common mode impedance is provided by the differential driver 10 in that the current sources 12 and 16 are constructed to have an impedance of approximately 3–4 Kohms while the transistors 14-1 through 14-4 have an active impedance of approximately 300–400 ohms. Thus, the common mode impedance of the differential driver 10 is based on the parallel combination of the current sources in series with an active transistor, which produces a common mode impedance of approximately 30 ohms. The low common mode impedance provides for faster correction of common mode disturbances produced by noise on the line and other EMI interference. In addition, the biasing circuit 18 allows for the differential driver 10 to be driven by a lower voltage power supply. For example, the supply voltage may be 2.5 volts in comparison to 3.3 volts of previous embodiments.

In many applications of the differential driver 10, the output terminals 28 and 30 are coupled to another digital driver that operates from a 3.3 volt source. In this configuration, the differential driver 10 would be deactivated such that the other digital driver may drive output terminals 28 and 30. In this configuration, some of the transistors within the switching module may be subject to reverse biasing, thereby producing leakage current. To avoid biasing the transistors, the differential driver 10 may include over voltage protection circuitry. Such over voltage protection circuitry is illustrated in FIG. 2 corresponding to transistor 14-1 or 14-3.

Figure 2:
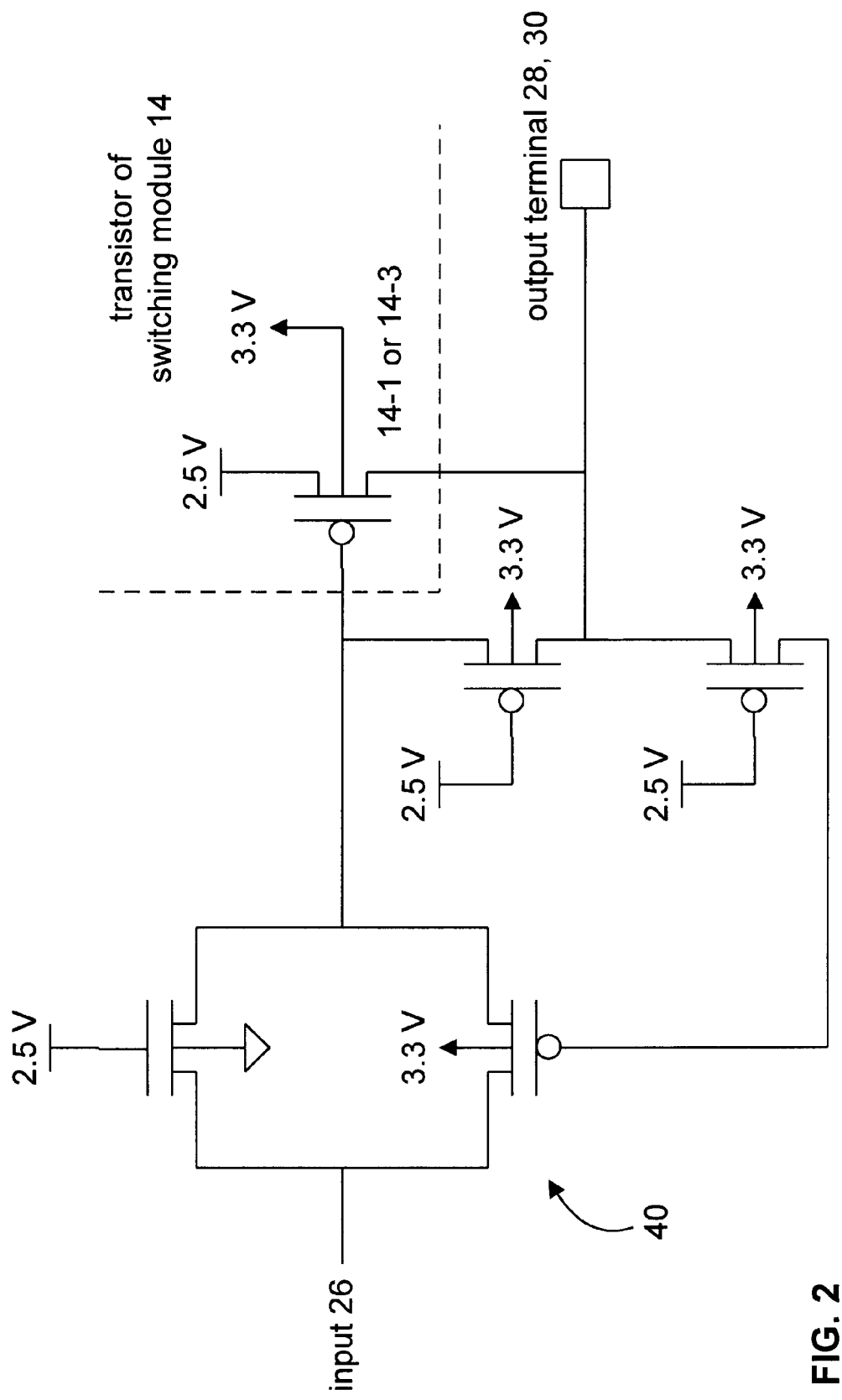
FIG. 2 illustrates a schematic block diagram of an over-voltage protection circuit in accordance with the present invention.

As shown in FIG. 2, transistor 14-1 or 14-3 has its substrates coupled to a 3.3 voltage source while its drain, or source, is coupled to a 2.5-volt supply. To prevent reverse biasing, the over-voltage protection circuit 40 as shown is included. The over-voltage protection circuit includes a switch that includes an n-channel transistor and a p-channel transistor in series between the input 26 and the gate of transistor 14-1 or -3. As shown, the p-channel transistor of the over-voltage protection circuit 40 has its substrate coupled to 3.3 volts while the substrate of the n-channel transistor is coupled to the reference. In addition, since the output terminals 28 and 30 will be drive at 3.3 volts, the gate-to-source voltage of 14-1 or -3 needs to be controlled. To control this voltage, a p-channel transistor is coupled between the gate and source of transistor 14-1 or -3 where the p-channel has its substrate coupled to 3.3 volts. In this configuration, the added p-channel transistor will be slightly activated thereby applying approximately 3.3 volts to the gate of transistor 14-1 or -3, which disables it.

To control the switching of the p-channel transistor within the switch, another p-channel transistor is included which has its substrate coupled to 3.3 volts. With this coupling, the second p-channel is active thereby pulling the gate of the p-channel within the switch to approximately 3.3 volts which turns off the transistor. With this overvoltage protection circuit 40, transistors 14-1 and 14-3 are disabled thereby preventing potential damage to such transistors. In addition, the path coupling to input 26 is disabled. To provide balanced timing, the gates of transistors 14-4 and 14-2 may include a similar switching circuit.

Figure 3:
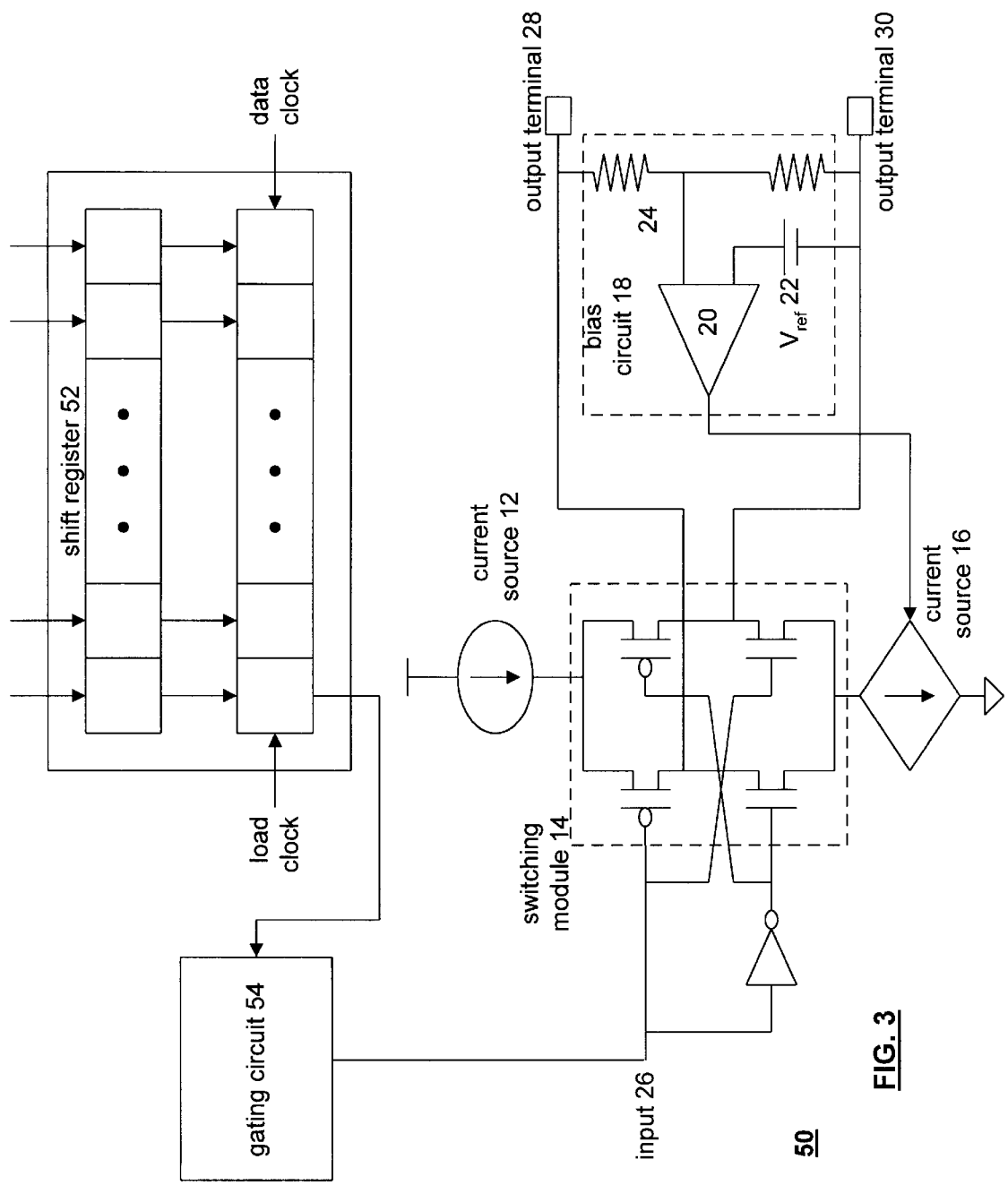
FIG. 3 illustrates a parallel-to-serial converter in accordance with the present invention.

FIG. 3 illustrates a parallel-to-serial transmitter 50 that includes a shift register 52, a gating circuit 54, and the differential driver 10. As shown, the shift register 52 includes a latching mechanism for receiving a plurality of digital bits and then loading them into a second register. When loaded in the second register, they are serially transmitted to the gating circuit 54. The gating circuit 54 includes latching circuitry to maintain the current bit value until the next bit is clocked. The gating circuit provides input 26 to the differential driver 10, which produces the differential output via output terminals 28 and 30. Such production of a differential output was discussed with reference to FIG. 1.

Figure 4:
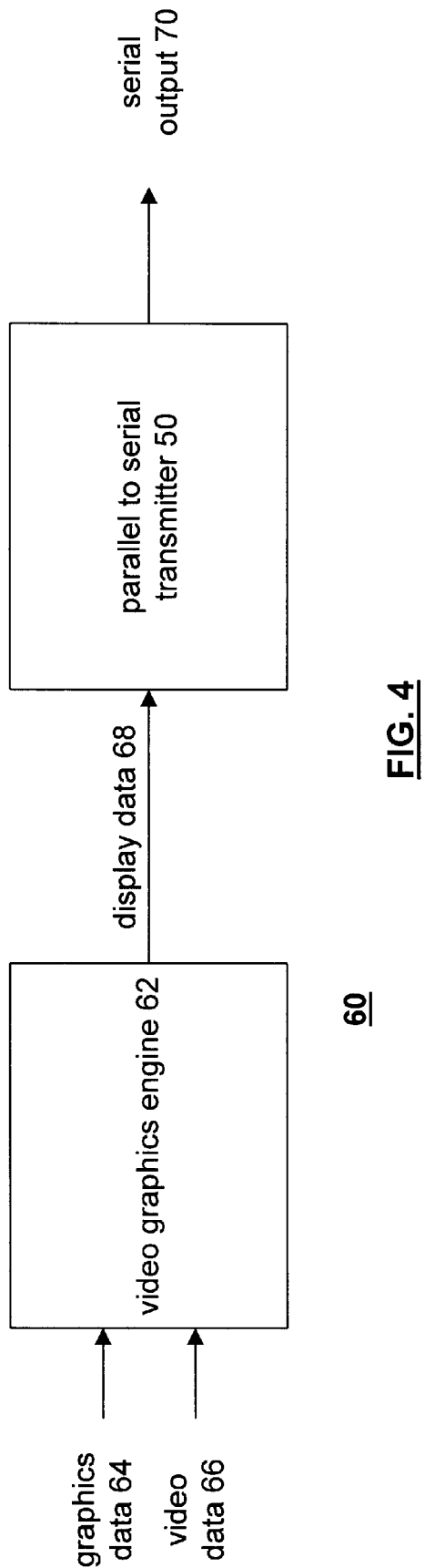
FIG. 4 illustrates a schematic block diagram of a video graphics circuit in accordance with the present invention.

FIG. 4 illustrates a schematic block diagram of a video graphics circuit 60 that includes a video graphics engine 62 and a parallel-to-serial transistor 50. The video graphics engine 62 is operably coupled to receive graphics data 64 and/or video data 66 and to produce therefrom display data 68. The functionality of the video graphics engine may be similar to such an element found in the All-in-Wonder board produced and manufactured by ATI International, or in the Rage Pro series of video graphics chips produced by ATI International.

The parallel-to-serial transmitter 50 is operably coupled to receive the display data 68 and to produce a serial output 70 thereof. The parallel-to-serial transmitter 50 was discussed with reference to FIG. 3.

The preceding discussion has presented a differential driver having low common mode impedance and applications thereof. By utilizing the bias circuit to control a dependent current source, the common mode voltage of the differential output can be maintained within desired specifications. Such specifications may be 1.25 volts plus or minus 10%. In addition, by utilizing the circuitry as described, the common mode impedance of the differential driver may be in the neighborhood of 30 ohms. As one of average skill in the art will appreciate, other embodiments may be derived from the teachings of the present invention without deviating from the scope of the claims.

What is claimed is:

1. A low common mode impedance differential driver comprises:

an independent current source;

a switching module operably coupled to the independent current source, wherein taps in the switching module provide a differential output from an input;

a dependent current source operably coupled to the switching module; and a bias control circuit operably coupled to the differential output and the dependent current source, wherein the bias control circuit provides a control signal to the dependent current source, which causes common mode of the differential output to be maintained within a desired tolerance.

2. The differential driver of claim 1, wherein the bias control circuit further comprises:

a voltage divider operably coupled to the differential output;

a voltage reference;

an amplifier having a first input coupled to a tap of the voltage divider, a second input coupled to the voltage reference, and an output coupled to a control input of the dependent current source.

3. The differential driver of claim 1, wherein the switching module further comprises a full bridge inverter operably coupled to generate a first current path between the independent current source and the dependent current source when the input is a logic 1 and to generate a second current path between the independent current source and the dependent current source when the input is a logic 0.

4. The differential driver of claim 3 further comprises over voltage protection circuitry operably coupled to the switching module, wherein the over voltage protection circuitry protects inverters of the switching module when another driver is driving differential output terminals at a higher voltage than a supply voltage of the differential driver, wherein the differential output is coupled to the differential output terminals.

5. A parallel to serial transmitter comprises:
shift register operably coupled to receive a plurality of digital bits in parallel;
gating circuitry operably coupled to the shift register to produce, in a serial manner, an input representative of each of the plurality of digital bits;
an independent current source;
a switching module operably coupled to the independent current source and the gating circuitry, wherein taps in the switching module produce a differential output from the input;
a dependent current source operably coupled to the switching module; and
a bias control circuit operably coupled to the differential output and the dependent current source, wherein the bias control circuit provides a control signal to the dependent current source, which causes common mode of the differential output to be maintained within a desired tolerance.

6. The parallel to serial transmitter of claim 5, wherein the bias control circuit further comprises:
a voltage divider operably coupled to the differential output;
a voltage reference;
an amplifier having a first input coupled to a tap of the voltage divider, a second input coupled to the voltage reference, and an output coupled to a control input of the dependent current source.

7. The parallel to serial transmitter of claim 5, wherein the switching module further comprises a full bridge inverter operably coupled to generate a first current path between the independent current source and the dependent current source when the input is a logic 1 and to generate a second current path between the independent current source and the dependent current source when the input is a logic 0.

8. The parallel to serial transmitter of claim 7 further comprises over voltage protection circuitry operably coupled to the switching module, wherein the over voltage protection circuitry protects inverters of the switching module when another driver is driving differential output terminals at a higher voltage than a supply voltage of the differential driver, wherein the differential output is coupled to the differential output terminals.

9. A video graphics circuit comprises:
a video graphics engine operably coupled to receive at least one of graphics data and video data, wherein the video graphics engine generates display data from the at least one of the graphics data and the video data, wherein color components of the display data are n-bits in length; and
a parallel to serial transmitter operably coupled to the video graphics engine, wherein the parallel to serial transmitter includes:
shift register operably coupled to receive a plurality of bits of the color components in parallel;
gating circuitry operably coupled to the shift register to produce, in a serial manner, an input representative of each of the plurality of bits;
an independent current source;
a switching module operably coupled to the independent current source and the gating circuitry, wherein taps in the switching module produce a differential output from the input;
a dependent current source operably coupled to the switching module; and
a bias control circuit operably coupled to the differential output and the dependent current source, wherein the bias control circuit provides a control signal to the dependent current source, which causes common mode of the differential output to be maintained within a desired tolerance.

10. The video graphics circuit of claim 9, wherein the bias control circuit further comprises:
a voltage divider operably coupled to the differential output;
a voltage reference;
an amplifier having a first input coupled to a tap of the voltage divider, a second input coupled to the voltage reference, and an output coupled to a control input of the dependent current source.

11. The video graphics circuit of claim 9, wherein the switching module further comprises a full bridge inverter operably coupled to generate a first current path between the independent current source and the dependent current source when the input is a logic and to generate a second current path between the independent current source and the dependent current source when the input is a logic 0.

12. The video graphics circuit of claim 10 further comprises over voltage protection circuitry operably coupled to the switching module, wherein the over voltage protection circuitry protects inverters of the switching module when another driver is driving differential output terminals at a higher voltage than a supply voltage of the differential driver, wherein the differential output is coupled to the differential output terminals.

* * * * *